(12) United States Patent
Kim et al.

(10) Patent No.: US 12,113,007 B2
(45) Date of Patent: *Oct. 8, 2024

(54) FLEXIBLE CIRCUIT FILM HAVING A POWER WIRING SET AND DISPLAY APPARATUS HAVING SAME

(71) Applicant: Samsung Display Co., Ltd., Yongin-Si (KR)

(72) Inventors: BoYeon Kim, Seoul (KR); Whee-Won Lee, Busan (KR); Myeong Su Kim, Hwaseong-si (KR); Sang Hyun Lee, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/230,069

(22) Filed: Aug. 3, 2023

(65) Prior Publication Data

US 2023/0378045 A1 Nov. 23, 2023

Related U.S. Application Data

(63) Continuation of application No. 17/023,271, filed on Sep. 16, 2020, now Pat. No. 11,721,619.

(30) Foreign Application Priority Data

Oct. 23, 2019 (KR) .................... 10-2019-0132085

(51) Int. Cl.
*H01L 23/498* (2006.01)
*H01L 23/00* (2006.01)
*H10K 59/131* (2023.01)

(52) U.S. Cl.
CPC .... *H01L 23/49838* (2013.01); *H01L 23/4985* (2013.01); *H01L 24/16* (2013.01); *H10K 59/131* (2023.02); *H01L 2224/16225* (2013.01)

(58) Field of Classification Search
CPC ........... H01L 23/49838; H01L 23/4985; H01L 24/16; H01L 2224/16225; H10K 59/131;
(Continued)

(56) References Cited

U.S. PATENT DOCUMENTS

2002/0109814 A1 8/2002 Murahashi et al.
2006/0250451 A1 11/2006 Suzuki et al.
(Continued)

FOREIGN PATENT DOCUMENTS

EP 2772797 A2 9/2014
KR 10-2013-0071140 A 6/2013
(Continued)

*Primary Examiner* — Nduka E Ojeh
*Assistant Examiner* — Laura M Dykes
(74) *Attorney, Agent, or Firm* — Innovation Counsel LLP

(57) ABSTRACT

A flexible circuit film includes the following elements: a base film; a first power input terminal, a second power input terminal, a first power output terminal, and a second power output terminal each disposed on the base film; an integrated circuit chip disposed between the first power input terminal and the first power output terminal and overlapping the base film; first power wiring disposed on the base film, connecting the first power input terminal to the first power output terminal, and including a first connection part; and second power wiring disposed on the base film, connecting the second power input terminal to the second power output terminal, and including a second connection part. The first connection part and the second connection part are disposed between the base film and the integrated circuit chip, overlap the integrated circuit chip, and are spaced from each other.

20 Claims, 15 Drawing Sheets

(58) Field of Classification Search
CPC . H10K 59/10; H05K 2201/10128; H05K 1/11
USPC .......................................................... 257/40
See application file for complete search history.

(56) References Cited

U.S. PATENT DOCUMENTS

| | | |
|---|---|---|
| 2007/0012774 A1 | 1/2007 | Cho et al. |
| 2008/0137275 A1 | 6/2008 | Tada |
| 2008/0165483 A1 | 7/2008 | Tanaka et al. |
| 2015/0302815 A1 | 10/2015 | Marushima et al. |
| 2017/0287814 A1 | 10/2017 | Kim et al. |
| 2019/0164877 A1 | 5/2019 | Cho et al. |
| 2020/0214127 A1* | 7/2020 | Choi ...................... H05K 1/189 |

FOREIGN PATENT DOCUMENTS

| | | |
|---|---|---|
| KR | 10-2014-0050831 A | 4/2014 |
| KR | 10-2015-0055377 A | 5/2015 |
| KR | 10-2016-0011250 A | 2/2016 |
| KR | 10-2018-0070919 A | 6/2018 |

* cited by examiner

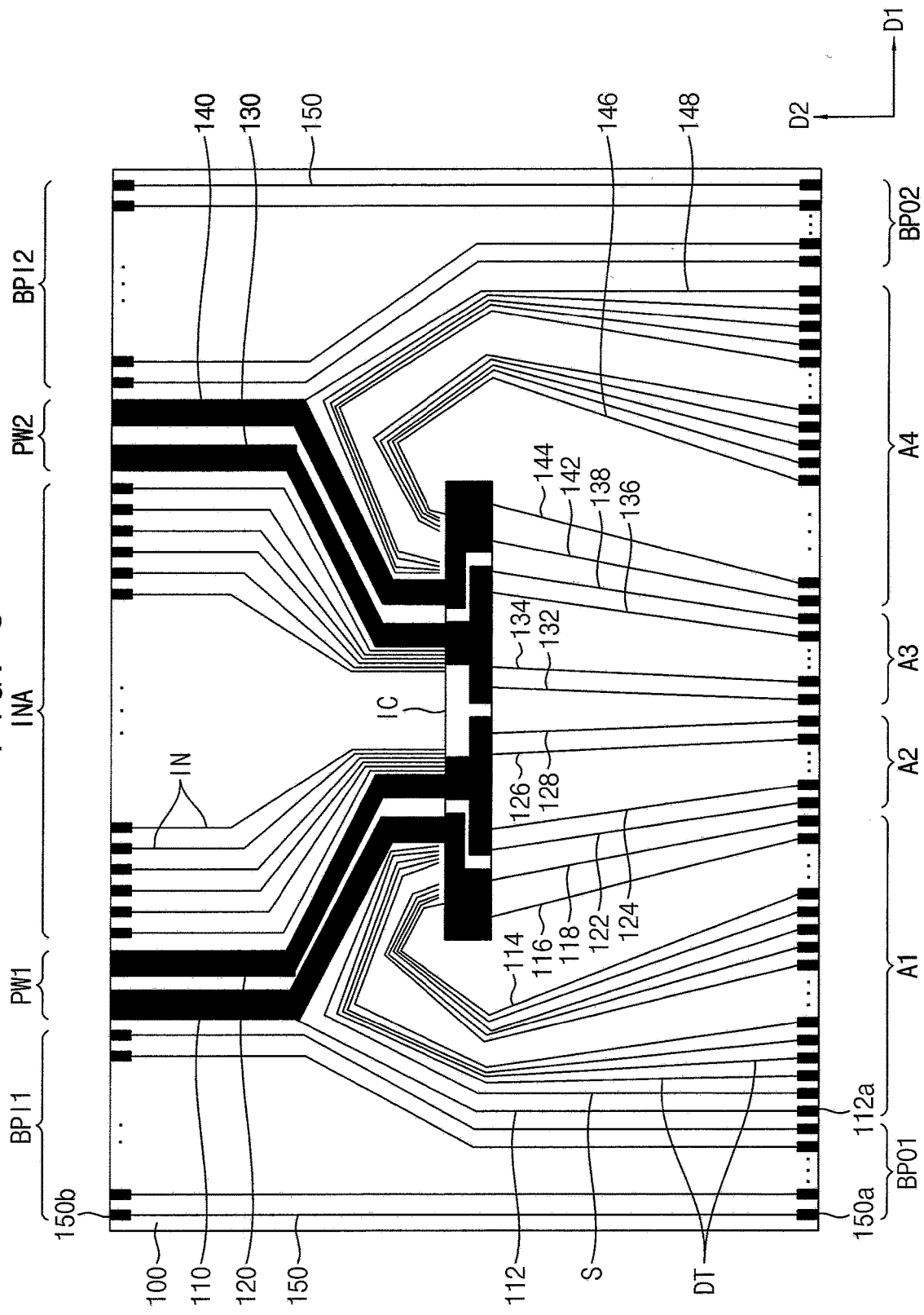

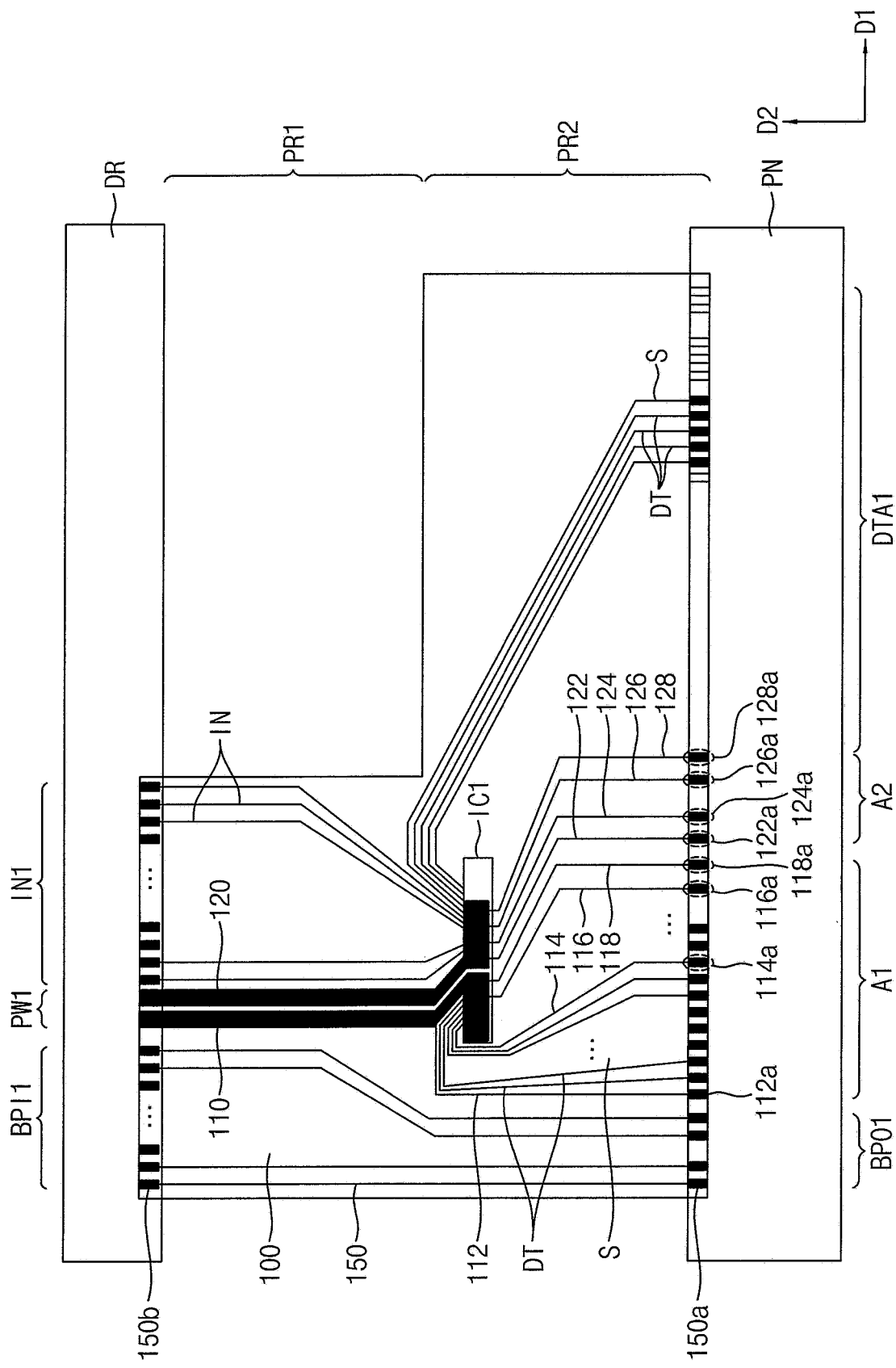

FLEXIBLE CIRCUIT FILM HAVING A POWER WIRING SET AND DISPLAY APPARATUS HAVING SAME

CROSS-REFERENCE TO RELATED APPLICATION(S)

This application is a continuation application of U.S. patent application Ser. No. 17/023,271 filed on Sep. 16, 2020, which claims priority under 35 USC § 119 to Korean Patent Application No. 10-2019-0132085 filed on Oct. 23, 2019 in the Korean Intellectual Property Office (KIPO), the disclosures of which are incorporated herein in their entirety by reference.

BACKGROUND

1. Technical Field

The technical field relates to a flexible circuit film and a display apparatus including the flexible circuit film.

2. Description of the Related Art

A display apparatus, such as a plasma display apparatus, a liquid crystal display apparatus, or an organic light emitting display apparatus, may display images according to input signals.

The display apparatus may include a driving circuit unit, a display panel, and a flexible circuit film connecting the driving circuit unit and the display panel.

SUMMARY

Example embodiments may be related a flexible circuit film having desirable wiring layout efficiency.

Example embodiments may be related to a display apparatus including the flexible circuit film.

According to example embodiments, a flexible circuit film may include a base film including an input part where input terminals including a first power input terminal and a second power input terminal are disposed and an output part where output terminals including first power output terminals and second power output terminals are disposed, the output part opposing the input part, an integrated circuit chip disposed on the base film between the input part and the output part, a first power wiring disposed on the base film, disposed adjacent to the first power input terminal and the first power output terminals, and including a first connection part disposed between the base film and the integrated circuit chip, and a second power wiring disposed on the base film, disposed adjacent to the second power input terminal and the second power output terminals, and including a second connection part disposed between the base film and the integrated circuit chip, the second connection part being spaced apart from the first connection part.

In example embodiments, the first power wiring may further include a first power input wiring electrically coupling the first power input terminal and the first connection part and first power output wirings electrically coupling the first connection part and the first power output terminals, respectively.

In example embodiments, the second power wiring may further include a second power input wiring electrically coupling the second power input terminal and the second connection part and second power output wirings electrically coupling the second connection part and the second power output terminals, respectively.

In example embodiments, a width of the first power input wiring may be larger than a width of the first power output wiring. In addition, a width of the second power input wiring is larger than a width of the second power output wiring.

In example embodiments, the flexible circuit film may further include a plurality of data input wirings and a plurality of data output wirings. Here, the input terminals may further include data input terminals, and the data input wirings may be electrically coupled to the data input terminals, respectively. In addition, the output terminals may further include data output terminals, and the data output wirings may be electrically coupled to the data output terminals, respectively.

In example embodiments, the integrated circuit chip may include a first side close to the input part and a second side close to the output part. In addition, the data input wirings may be electrically coupled to the first side of the integrated circuit chip, respectively. Further, the data output wirings may be electrically coupled to the second side of the integrated circuit chip, respectively.

In example embodiments, a portion of the data output wirings may be electrically coupled to the first side of the integrated circuit chip.

In example embodiments, the output part may include a first area where the first power output terminals and a portion of the data output terminals are disposed and a second area where the second power output terminals and a portion of the data output terminals are disposed, the second area being adjacent to the first area.

In example embodiments, the output part may further include a third area where the first and second power output terminals are not disposed and only a portion of the data output terminals is disposed, the third area being adjacent to the second area.

In example embodiments, the input terminals may further include a third power input terminal and a fourth power input terminal. In addition, the output terminals may further include third power output terminals and fourth power output terminals. Further, the flexible circuit film may further include a third power wiring disposed on the base film, electrically coupled to the third power input terminal and the third power output terminals, and including a third connection part disposed between the base film and the integrated circuit chip, the third connection part being spaced apart from the first and second connection parts and a fourth power wiring disposed on the base film, electrically coupled to the fourth power input terminal and the fourth power output terminals, and including a fourth connection part disposed between the base film and the integrated circuit chip, the fourth connection part being spaced apart from the first to third connection parts.

In example embodiments, a first power voltage may be applied to the first power wiring, and a second power voltage different from the first power voltage is applied to the second power wiring.

According to example embodiments, a display apparatus may include a display panel having pixels configured to display an image, a flexible circuit film disposed adjacent to the display panel, and a driving circuit unit disposed adjacent to the flexible circuit film. Here, the flexible circuit film may include a base film including an input part where input terminals including a first power input terminal and a second power input terminal are disposed and an output part where output terminals including first power output terminals and second power output terminals are disposed, the output part opposing the input part, an integrated circuit chip disposed on the base film between the input part and the output part, a first power wiring disposed on the base film, disposed adjacent to the first power input terminal and the first power output terminals, and including a first connection part disposed between the base film and the integrated circuit chip, and a second power wiring disposed on the base film, disposed adjacent to the second power input terminal and the second power output terminals, and including a second connection part disposed between the base film and the integrated circuit chip, the second connection part being spaced apart from the first connection part. In addition, the input terminals of the input part of the flexible circuit film may be disposed adjacent to first pad electrodes of the driving circuit unit, respectively. Further, the output terminals of the output part of the flexible circuit film may be disposed adjacent to second pad electrodes of the display panel, respectively.

In example embodiments, the first power wiring may further include a first power input wiring electrically coupling the first power input terminal and the first connection part and first power output wirings electrically coupling the first connection part and the first power output terminals, respectively. In addition, the second power wiring may further include a second power input wiring electrically coupling the second power input terminal and the second connection part and second power output wirings electrically coupling the second connection part and the second power output terminals, respectively.

In example embodiments, an anisotropic conductive film (ACF) may be disposed between the input terminals of the input part of the flexible circuit film and the first pad electrodes of the driving circuit unit and between the output terminals of the output part of the flexible circuit film and the second pad electrodes of the display panel.

In example embodiments, the flexible circuit film may further include a plurality of data input wirings and a plurality of data output wirings. Here, the input terminals may further include data input terminals, and the data input wirings may be electrically coupled to the data input terminals, respectively. In addition, the output terminals may further include data output terminals, and the data output wirings may be electrically coupled to the data output terminals, respectively.

In example embodiments, the display panel may include data lines, a first power voltage wiring, and a second power voltage wiring. In addition, the data output terminals may be electrically coupled to the data lines, respectively. Further, the first power output terminals may be electrically coupled to the first power voltage wiring, respectively.

In example embodiments, the display panel may be an organic light emitting display panel and may include pixels each including a first electrode, a light emitting layer, and a second electrode. In addition, the second power output terminals may be electrically coupled to the second electrode.

In example embodiments, the display apparatus may further include a second flexible circuit film electrically coupling the display panel and the driving circuit unit. Here, the second flexible circuit film may include a second base film including an input part where input terminals including a third power input terminal and a fourth power input terminal are disposed and an output part where output terminals including third power output terminals and fourth power output terminals are disposed, the output part opposing the input part, a second integrated circuit chip disposed on the second base film, a third power wiring disposed on the second base film, electrically coupled to the third power input terminal and the third power output terminals, and including a third connection part disposed between the second base film and the second integrated circuit chip, and a fourth power wiring disposed on the second base film, electrically coupled to the fourth power input terminal and the fourth power output terminals, and including a fourth connection part disposed between the second base film and the second integrated circuit chip, the fourth connection part being spaced apart from the third connection part.

In example embodiments, the flexible circuit film and the second flexible circuit film may at least partially overlap each other. In addition, the output part of the flexible circuit film and the output part of the second flexible circuit film may be disposed in parallel.

According to example embodiments, a display apparatus may include a display panel having pixels configured to display an image, a driving circuit unit configured to provide a signal for driving the display panel, a first power voltage, and a second power voltage different from the first power voltage, and a flexible circuit film disposed adjacent to the display panel and the driving circuit unit and configured to transmit the first power voltage and the second power voltage to the display panel. Here, the flexible circuit film may include a base film, an integrated circuit chip disposed on the base film, a first power wiring to which the first power voltage is applied, the first power wiring including a first connection part disposed between the integrated circuit chip and the base film, and a second power wiring to which the second power voltage is applied, the second power wiring including a second connection part disposed between the integrated circuit chip and the base film, the second connection part being spaced apart from the first connection part.

According to example embodiments, a display apparatus may include a display panel including a display area where pixels configured to display an image are disposed and a peripheral area which is a non-display area adjacent to the display area, pad electrodes being disposed in a first direction in the peripheral area and a flexible circuit film disposed adjacent to the peripheral area of the display panel. Here, the flexible circuit film may include a base film, a plurality of data wirings, a first power wiring, and a second power wiring disposed on the base film, a plurality of first power output terminals disposed adjacent to the first power wiring, a plurality of second power output terminals disposed adjacent to the second power wiring, and a plurality of data output terminals disposed adjacent to the data wirings, respectively. In addition, the first and second power output terminals and the data output terminals may be disposed in the first direction at one end of the base film and disposed adjacent to the pad electrodes, respectively.

In example embodiments, the one end of the base film may include a first area and a second area disposed in the first direction. In addition, the first power output terminals and a portion of the data output terminals may be disposed in the first area, and the second power output terminals and a portion of the data output terminals may be disposed in the second area.

In example embodiments, the flexible circuit film may further include a plurality of third power wirings and a plurality of fourth power wirings disposed on the base film, a plurality of third power output terminals electrically coupled to the third power wiring, and a plurality of fourth power output terminals electrically coupled to the fourth power wiring. Here, the one end of the base film may further include a third area and a fourth area disposed in the first direction subsequent to the first area and the second area. In addition, the third power output terminals and a portion of the data output terminals may be disposed in the third area, and the fourth power output terminals and a portion of the data output terminals may be disposed in the fourth area.

An embodiment may be related to a flexible circuit film. The flexible circuit film may include the following elements: a base film; a first power input terminal, a second power input terminal, a first power output terminal set, and a second power output terminal set each disposed on the base film; an integrated circuit chip disposed between the first power input terminal and the first power output terminal set, disposed between the second power input terminal and the second power output terminal set, and overlapping the base film; a first power wiring set disposed on the base film, electrically coupling the first power input terminal to the first power output terminal set, and including a first connection part; and a second power wiring set disposed on the base film, electrically coupling the second power input terminal to the second power output terminal set, and including a second connection part. The first connection part may be disposed between the base film and the integrated circuit chip and may overlap the integrated circuit chip. The second connection part may be disposed between the base film and the integrated circuit chip, may overlap the integrated circuit chip, and may be spaced from the first connection part in a first direction.

The first power wiring set may include a first power input wire and a first power output wire set. The first power input wire electrically couples the first power input terminal to the first connection part. The first power output wire set electrically couples the first connection part to the first power output terminal set.

The second power wiring set may include a second power input wire and a second power output wire set. The first power input wire electrically couples the second power input terminal to the second connection part. The second power output wire set electrically couples the second connection part to the second power output terminal set.

The first power output wire set may include a first power output wire. The first power input wire may be wider than the first power output wire in the first direction. The second power output wire set may include a second power output wire. The second power input wire may be wider than the second power output wire in the first direction.

The flexible circuit film may include the following elements: data input wires; data output wires; data input terminals respectively electrically coupled to the data input wires; and data output terminals respectively electrically coupled to the data output wires.

The flexible circuit film may include the following elements: first-group connectors; and second-group connectors disposed between the first-group connectors and the data output terminals. The data input wires may be electrically coupled to the first-group connectors, respectively. Data output wires of at least a first subset of the data output wires may be electrically coupled to the second-group connectors, respectively.

The flexible circuit film may include third-group connectors. The second-group connectors may be disposed between the third-group connectors and the data output terminals. Data output wires of a second subset of the data output wirings may be electrically coupled to the third-group connectors, respectively.

The base film may include a first area and a second area abutting the first area. The first power output terminal set and a first subset of the data output terminals may be disposed on the first area. The second power output terminal set and a second subset of the data output terminals may be disposed on the second area.

The base film may include a third area. The second area may be positioned between the first area and the third area. The first power output terminal set and the second power output terminal set may be disposed outside the third area. A third subset of the data output terminals may be disposed on the third area.

The flexible circuit film may include the following elements: a third power input terminal, a fourth power input terminal, a third power output terminal set, and a fourth power output terminal set each disposed on the base film; a third power wiring set disposed on the base film, electrically coupling the third power input terminal to the third power output terminal set, and including a third connection part; and a fourth power wiring set disposed on the base film, electrically coupling the fourth power input terminal to the fourth power output terminal set, and including a fourth connection part. The third connection part may be disposed between the base film and the integrated circuit chip and overlaps the integrated circuit chip. The fourth connection part may be disposed between the base film and the integrated circuit chip and overlaps the integrated circuit chip. The first connection part, the second connection part, the third connection part, and the fourth connection part may be spaced from each other.

A first power voltage may be applied to the first power wiring set. A second power voltage different from the first power voltage may be applied to the second power wiring set.

An embodiment may be related to a display apparatus. The display apparatus may include the following elements: a display panel including pixels, including a second pad electrode set, and configured to display an image; a first flexible circuit film electrically coupled to the display panel; and a driving circuit unit including a first pad electrode set and electrically coupled to the flexible circuit film.

The first flexible circuit film may include the following elements: a first base film; a first power input terminal, a second power input terminal, a first power output terminal set, and a second power output terminal set each disposed on the first base film, wherein the first power input terminal and the second power input terminal may be electrically coupled to the first pad electrode set, and wherein the first power output terminal set and the second power output terminal set may be electrically coupled to the second pad electrode set; a first integrated circuit chip disposed between the first power input terminal and the first power output terminal set, disposed between the second power input terminal and the second power output terminal set, and overlapping the first base film; a first power wiring set disposed on the first base film, electrically coupling the first power input terminal to the first power output terminal set, and including a first connection part, wherein the first connection part may be disposed between the first base film and the first integrated circuit chip and overlaps the first integrated circuit chip; and a second power wiring set disposed on the first base film, electrically coupling the second power input terminal to the second power output terminal set, and including a second connection part, wherein the second connection part may be disposed between the first base film and the first integrated circuit chip, may overlap the first integrated circuit chip, and may be spaced from the first connection part in a first direction.

The first power wiring set may include a first power input wire electrically coupling the first power input terminal to the first connection part and may include first power output wire set electrically coupling the first connection part to the first power output terminal set. The second power wiring set may include a second power input wire electrically coupling the second power input terminal to the second connection part and may include second power output wire set electrically coupling the second connection part to the second power output terminal set.

The display apparatus of may include the following elements: a first anisotropic conductive film disposed between the first power input terminal and the first pad electrode set and electrically coupling the first power input terminal to a pad electrode of the first pad electrode set; and a second anisotropic conductive film disposed between the first power output terminal set and the second pad electrode set and electrically coupling the first power output terminal set to some pad electrodes of the second pad electrode set.

The flexible circuit film may include the following elements: data input wires; data output wires; data input terminals respectively electrically coupled to the data input wires; and data output terminals respectively electrically coupled to the data output wires.

The display panel may include data lines, a first power voltage wiring set, and a second power voltage wiring set. The data output terminals may be electrically coupled to the data lines, respectively. The first power output terminal set may be electrically coupled to the first power voltage wiring set. The second power output terminal set may be electrically coupled to the second power voltage wiring set.

The pixels may include a first pixel. The first pixel may include a first electrode, a light emitting layer, and a second electrode. A power output terminal of the second power output terminal set may be electrically coupled to the second electrode.

The display apparatus may include a second flexible circuit film electrically coupling the display panel to the driving circuit unit. The second flexible circuit film may include the following elements: a second base film; a third power input terminal, a fourth power input terminal, a third power output terminal set, and a fourth power output terminal set each disposed on the second base film, wherein the third power input terminal and the fourth power input terminal may be electrically coupled to the third pad electrode set, and wherein the third power output terminal set and the fourth power output terminal set may be electrically coupled to the fourth pad electrode set; an second integrated circuit chip disposed between the third power input terminal and the third power output terminal set, disposed between the fourth power input terminal and the fourth power output terminal set, and overlapping the second base film; a third power wiring set disposed on the second base film, electrically coupling the third power input terminal to the third power output terminal set, and including a third connection part. The third connection part may be disposed between the second base film and the second integrated circuit chip and may overlap the second integrated circuit chip; and a fourth power wiring set disposed on the second base film, electrically coupling the fourth power input terminal to the fourth power output terminal set, and including a fourth connection part, wherein the fourth connection part may be disposed between the second base film and the second integrated circuit chip, may overlap the second integrated circuit chip, and may be spaced from the third connection part in the first direction.

The first flexible circuit film and the second flexible circuit film may at least partially overlap each other. A row of terminals of the first power output terminal set may be oriented parallel to a row of terminals of the third power output terminal set.

An embodiment may be related to a display apparatus. The display apparatus may include the following elements: a display panel having pixels and configured to display an image; a driving circuit unit configured to provide a first power voltage and a second power voltage different from the first power voltage; and a flexible circuit film electrically coupling the display panel to the driving circuit unit and configured to transmit the first power voltage and the second power voltage to the display panel. The flexible circuit film may include the following elements: a base film; an integrated circuit chip disposed on the base film; a first power wiring set configured to receive the first power voltage and including a first connection part disposed between the integrated circuit chip and the base film; and a second power wiring set configured to receive the second power voltage and including a second connection part disposed between the integrated circuit chip and the base film, the second connection part being spaced from the first connection part.

An embodiment may be related to a display apparatus. The display apparatus may include the following elements: a display panel including a display area, pixels, a peripheral area, and pad electrodes, wherein the pixels may display an image and may be disposed in the display area, wherein the peripheral area may abut the display area, and wherein the pad electrodes may be disposed in a first direction in the peripheral area; and a flexible circuit film electrically coupled to the peripheral area of the display panel. The flexible circuit film may include the following elements: a base film; data wires, a first power wiring set, and a second power wiring set each disposed on the base film; first power output terminals electrically coupled to the first power wiring set; second power output terminals electrically coupled to the second power wiring set; and data output terminals electrically coupled to the data wires, respectively. The first power output terminals, the second power output terminals, and the data output terminals may be disposed in the first direction along an edge of the base film and may be electrically coupled to the pad electrodes, respectively.

The base film may include a first area and a second area disposed in the first direction. The first power output terminals and a first subset of the data output terminals may be disposed on the first area. The second power output terminals and a second subset of the data output terminals may be disposed on the second area.

The flexible circuit film may include the following elements: a third power wiring set and a fourth power wiring set; third power output terminals electrically coupled to the third power wiring set; and fourth power output terminals electrically coupled to the fourth power wiring set. The base film may include a third area and a fourth area disposed in the first direction and neighboring the first area and the second area. The third power output terminals and a third subset of the data output terminals may be disposed on the third area. The fourth power output terminals and a fourth subset of the data output terminals may be disposed on the fourth area.

According to embodiments, a first connection part and a second connection part may overlap different portions of an integrated circuit chip, such that power wires may be efficiently distributed. Advantageously, local overheating potentially due to concentration of currents may be prevented.

BRIEF DESCRIPTION OF THE DRAWINGS

FIG. 3 is a plan view illustrating a flexible circuit film of the display apparatus shown in FIG. 1 according to example embodiments.

FIG. 7A is a plan view illustrating a first flexible circuit film of the flexible circuit film of FIG. 6 according to example embodiments.

DETAILED DESCRIPTION OF THE EMBODIMENTS

Example embodiments are described with reference to the accompanying drawings. Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively. The term "connect (or couple)" may mean "electrically connect (or electrically couple)" or "electrically connected (or electrically coupled) through no intervening transistor." The term "insulate" may mean "electrically insulate" or "electrically isolate." The term "drive" may mean "operate" or "control." The term "wiring" may mean "wiring set" or "wire." An area may mean an area of a base film or an area of a flexible circuit film.

Figure 1:
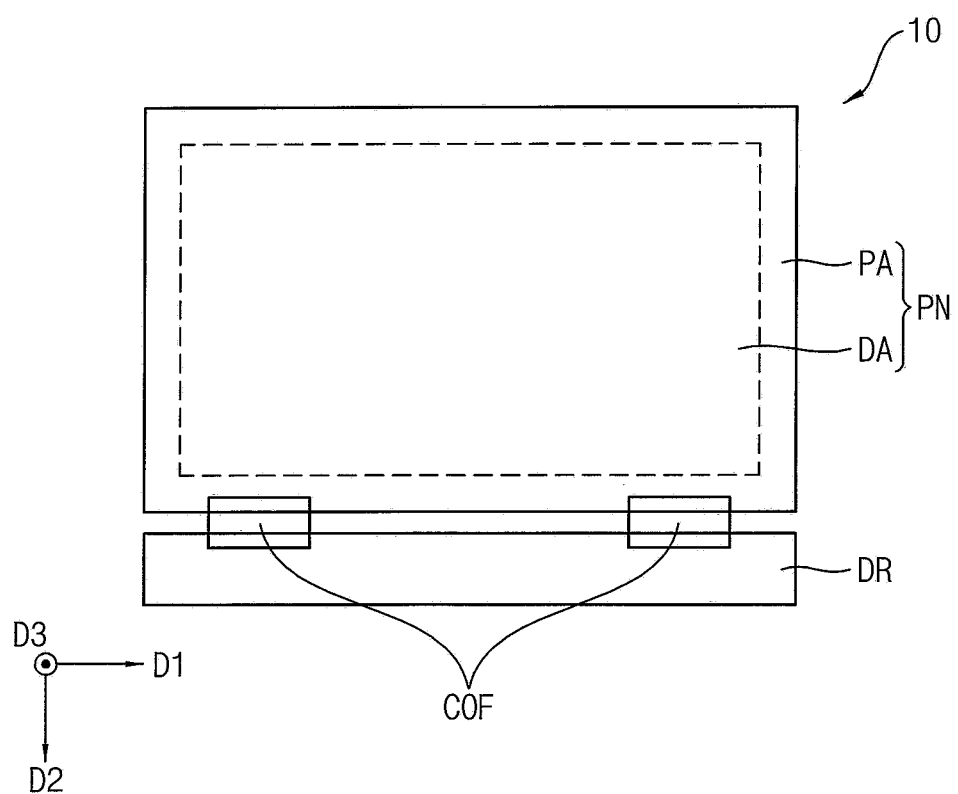
FIG. 1 is a plan view illustrating a display apparatus according to example embodiments.

FIG. 1 is a plan view illustrating a display apparatus according to example embodiments.

Referring to FIG. 1, the display apparatus may include a driving circuit unit DR, a flexible circuit film COF, and a display panel PN.

The display panel PN may be an organic light emitting display panel and may include a plurality of pixels each including a first electrode, a light emitting layer, and a second electrode. The display panel PN may be disposed on a plane defined by a first direction D1 and a second direction D2 that is perpendicular to the first direction D1. The display panel PN may include a display area DA and a peripheral area PA.

The driving circuit unit DR may provide a signal for driving the display panel PN, a first power voltage, and a second power voltage. The driving circuit DR may include a timing controller, a data driver, a power controller, a sensing signal processor, etc.

The driving circuit unit DR may be disposed adjacent to the display panel PN. The driving circuit unit DR may extend in the first direction D1 and may be disposed adjacent to the display panel PN in the second direction D2.

The flexible circuit film COF may be connected to the display panel PN and the driving circuit unit DR to transmit signals and voltages between the display panel PN and the driving circuit unit DR. The flexible circuit film COF may be a chip on film (COF) structure in which a semiconductor chip is mounted on a printed circuit board (PCB) in the form of a thin film.

Figure 2:
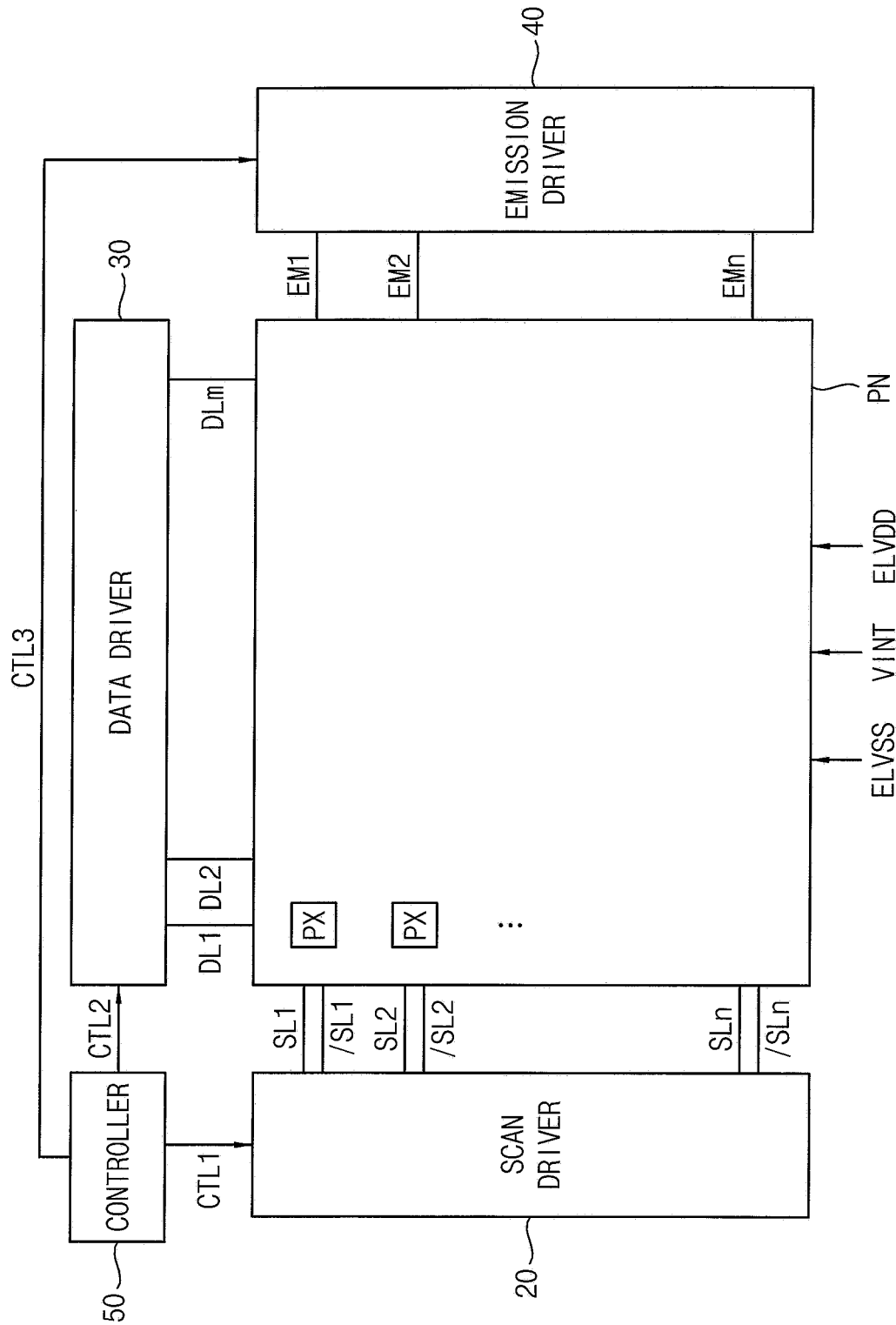
FIG. 2 is a block diagram illustrating a display apparatus according to example embodiments.

FIG. 2 is a block diagram illustrating a display apparatus according to example embodiments.

Referring to FIG. 1 and FIG. 2, the display apparatus may include a display panel PN, a scan driver 20, a data driver 30, an emission control driver 40, and a controller 50.

The display panel PN may include a plurality of pixels PX configured to display an image in a third direction D3 (indicated in FIG. 1). For example, the display panel PN may include n×m pixels PX (where n and m are integers greater than 1), which are electrically connected (through transistors) to scan lines SL1, SL2 to SLn and data lines DL1, DL2 to DLm.

One pixel PX may include a plurality of thin film transistors, a capacitor, and a light emitting diode; the light emitting diode may include a first electrode, a second electrode, and a light emitting layer between the first electrode and the second electrode. A second power voltage ELVSS may be applied to the second electrode. A first power voltage ELVDD may be applied as a driving voltage of the light emitting diode.

The scan driver 20 may sequentially provide instances of a first scan signal to the pixels PX through the scan lines SL1 to SLn and may sequentially provide instances of a second scan signal to the pixels PX through inverted scan lines /SL1, /SL2 to /SLn based on a first control signal CTL1. The second scan signal may be an inverted signal of the first scan signal.

The data driver 30 may provide data signals to the pixels PX through the data lines DL1 to DLm based on a second control signal CTL2.

The emission control driver 40 may sequentially provide instances of an emission control signal to the pixels PX through emission control lines EM1, EM2 to EMn based on a third control signal CTL3.

The controller 50 may control the scan driver 20, the data driver 30, and the emission control driver 40. The controller 50 may generate the control signals CTL1, CTL2, and CTL3 to control the scan driver 20, the data driver 30, and the emission control driver 40. The first control signal CTL1 for controlling the scan driver 20 may include a scan start signal, a scan clock signal, etc. The second control signal CTL2 for controlling the data driver 30 may include image data, a horizontal start signal, etc. The third control signal CTL3 for controlling the emission control driver 40 may include an emission control start signal, an emission control clock signal, etc.

The display apparatus may further include a power supply (not shown) that supplies a first power voltage ELVDD, a second power voltage ELVSS, and an initialization voltage VINT to the display panel PN.

Although not shown in the drawings, the display apparatus may further include a sensing unit for sensing a degree of degradation of the light emitting layer of the light emitting diode. A sensing signal may be provided from the display panel PN to the driving circuit DR (see FIG. 1) through the flexible circuit film COF (see FIG. 1), and the driving signal of the degraded pixel may be compensated using the sensing signal.

Figure 4A:
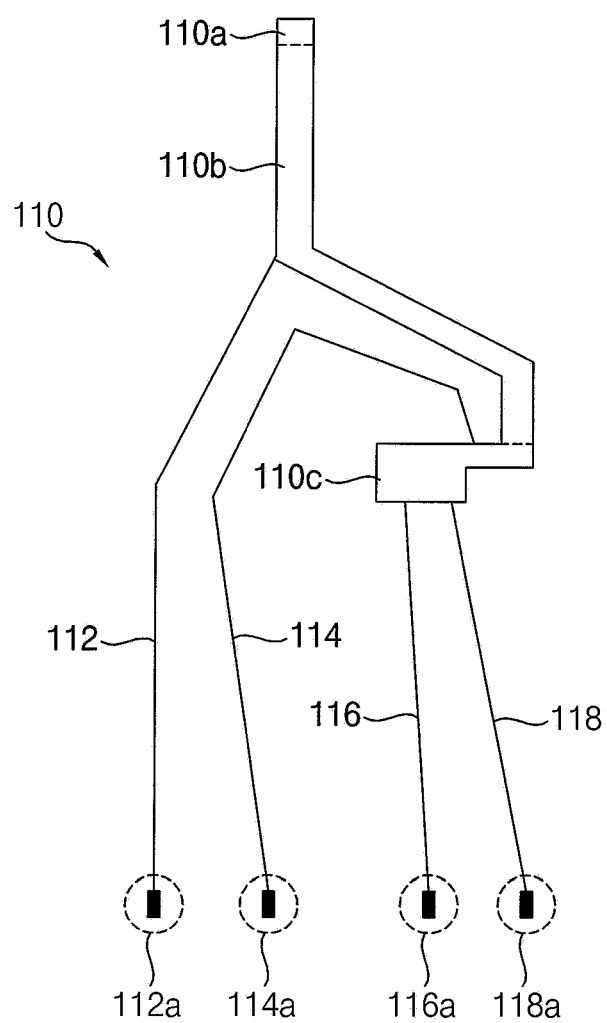
FIG. 4A is a plan view illustrating a first power wiring in FIG. 3 according to example embodiments.
Figure 4B:
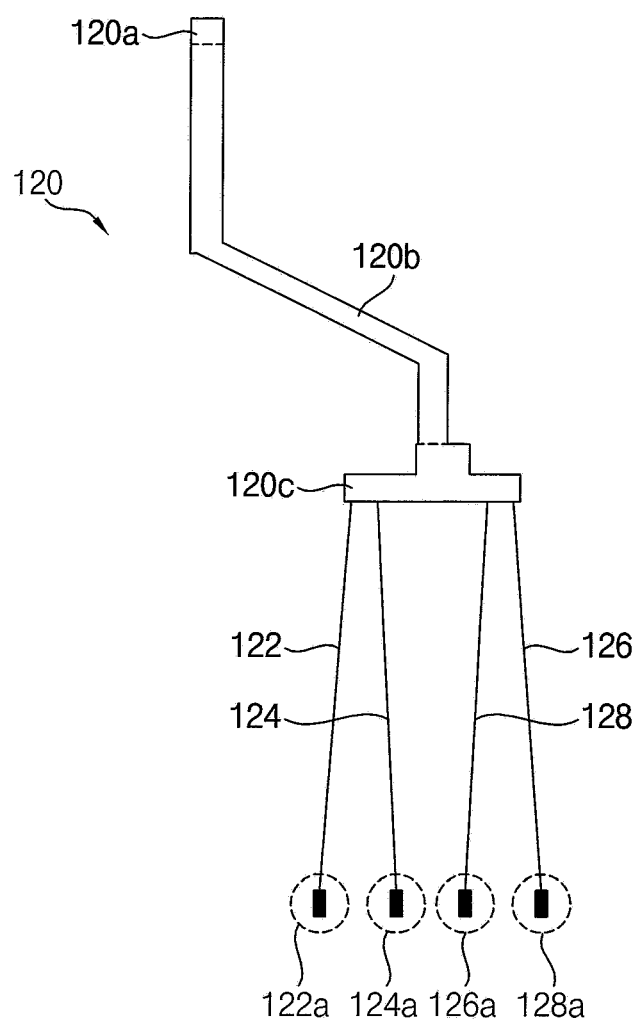
FIG. 4B is a plan view illustrating a second power wiring in FIG. 3 according to example embodiments.
Figure 4C:
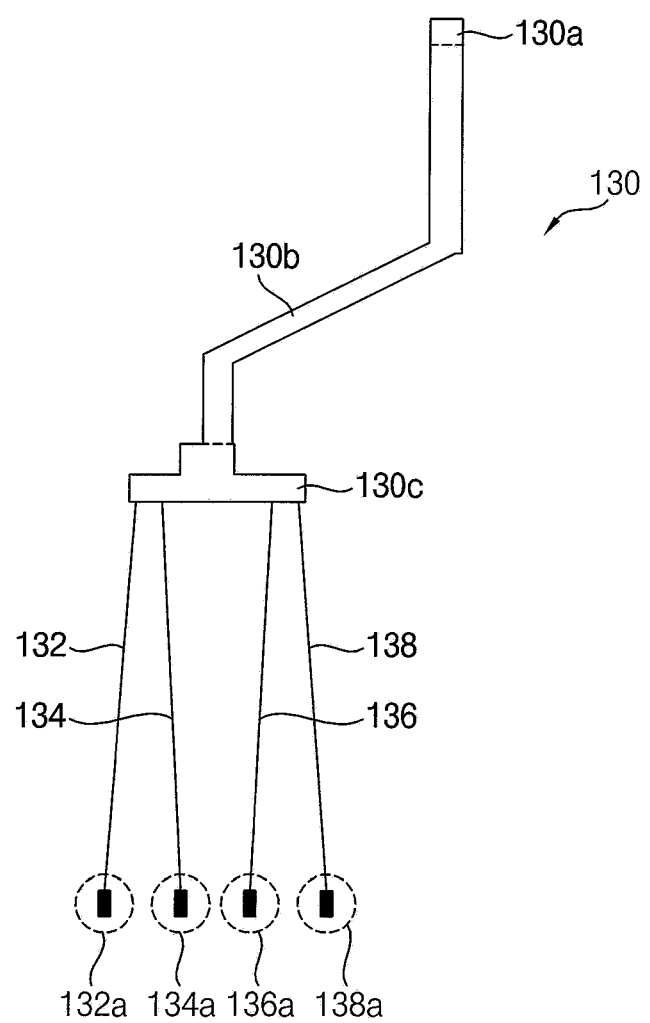
FIG. 4C is a plan view illustrating a third power wiring in FIG. 3 according to example embodiments.
Figure 4D:
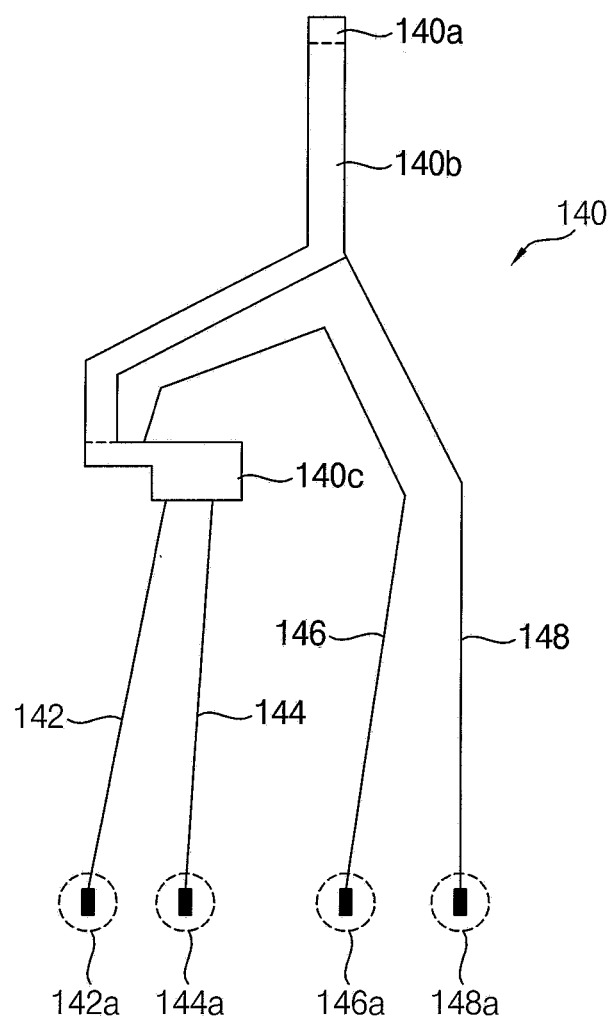
FIG. 4D is a plan view illustrating a fourth power wiring in FIG. 3 according to example embodiments.
Figure 5A:
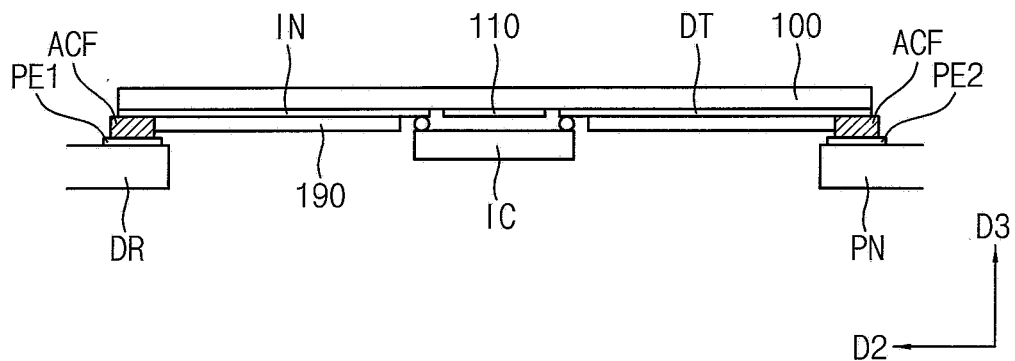
FIG. 5A is a cross-sectional view of the flexible circuit film of FIG. 3 taken along a data wiring and an input wiring according to example embodiments.
Figure 5B:
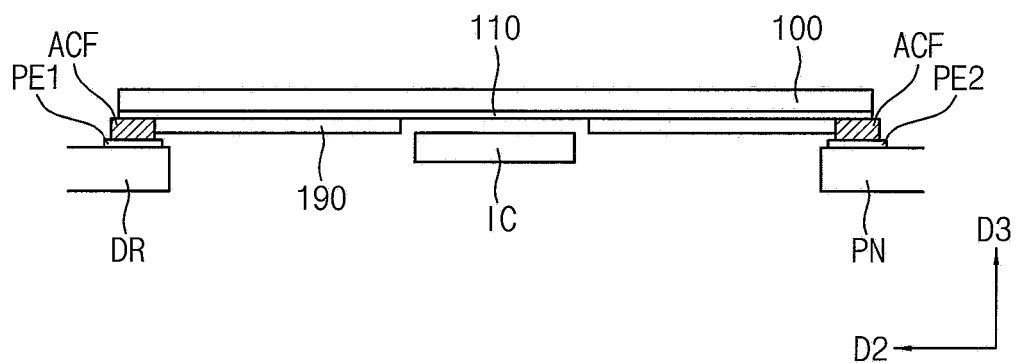
FIG. 5B is a cross-sectional view of the flexible circuit film of FIG. 3 taken along a first power wiring according to example embodiments.

FIG. 3 is a plan view illustrating a flexible circuit film of the display apparatus shown in FIG. 1, FIG. 4A is a plan view illustrating a first power wiring in FIG. 3, FIG. 4B is a plan view illustrating a second power wiring in FIG. 3, FIG. 4C is a plan view illustrating a third power wiring in FIG. 3, FIG. 4D is a plan view illustrating a fourth power wiring in FIG. 3, FIG. 5A is a cross-sectional view of the flexible circuit film of FIG. 3 taken along a data wiring and an input wiring, and FIG. 5B is a cross-sectional view of the flexible circuit film of FIG. 3 taken along a first power wiring according to example embodiments.

Referring to FIGS. 3, 4A to 4D, A, and 5B, the flexible circuit film COF may include a base film 100, an integrated circuit chip IC, a wiring layer, and a protective layer 190 for protecting the wiring layer.

The base film 100 may be formed of a polyimide resin, an epoxy resin, or one or more other known materials having flexibility.

Two edges of the base film 100 may be connected to the driving circuit unit DR (see FIG. 1) and the display panel PN (see FIG. 1), respectively. At the two edges, the base film 100 may include an input part that supports a plurality of input terminals and may include an output part that supports a plurality of output terminals.

The input terminals may include a first power input terminal, a second power input terminal, a third power input terminal, a fourth power input terminal, a plurality of data input terminals, and a plurality of bypass input terminals 150b.

The first power input terminal and the second power input terminal may be disposed in a first power input area PW1. The third power input terminal and the fourth power input terminal may be disposed in a second power input area PW2. The data input terminals may be disposed in a data input area INA. The bypass input terminals may be disposed in a first bypass input area BPI1 and a second bypass input area BPI2.

The first bypass input area BPI1, the first power input area PW1, the data input area INA, the second power input area PW2, and the second bypass input area BPI2 may be sequentially disposed in the first direction D1.

The output terminals may include a plurality of first power output terminals 112a, a plurality of second power output terminals, a plurality of third power output terminals, a plurality of fourth power output terminals, a plurality of data output terminals, and a plurality of bypass output terminals 150a.

The first power output terminals and some data output terminals may be disposed in a first area A1. The second power output terminals and some data output terminals may be disposed in a second area A2. The third power output terminals and some data output terminals may be disposed in a third area A3. The fourth power output terminals and some data output terminals may be disposed in a fourth area A4. The bypass output terminals may be disposed in a first bypass output area BPO1 and a second bypass output area BPO2.

The first bypass output area BPO1, the first area A1, the second area A2, the third area A3, the fourth area A4, and the second bypass output area BPO2 may be sequentially disposed in the first direction D1.

The input terminals may be exposed by the protective layer 190. The input terminals may be electrically connected to first pad electrodes PE1 of the driving circuit unit DR through an anisotropic conductive film (ACF) (which may include a conductive ball and/or an adhesive).

The wiring layer may be a conductive pattern layer disposed on the base film, and the wiring layer may include a conductive material such as a metal. The wiring layer may include a first power wiring 110, a second power wiring 120, a third power wiring 130, a fourth power wiring 140, a plurality of data input wirings IN, a plurality of data output wirings DT, a plurality of sensing wirings S, and a plurality of bypass wirings 150. The input terminals and the output terminals described above may be included in the wiring layer. Although the data output wirings DT or the sensing wirings S are illustrated as being partially connected to the first connection part 110c of the first power wiring 110 in FIG. 3, some or all of the data output wirings DT and/or the sensing wirings S may be spaced apart from the first power wiring 110 and electrically connected to the integrated circuit chip IC through one or more connectors, e.g., connection bumps or connection balls as illustrated in FIG. 5A.

The first power wiring 110 may include a first power input wiring 110b, a first connection part 110c, and first power output wirings 112, 114, 116, and 118. The first power input wiring 110b may connect the first power input terminal 110a to the first connection part 110c. The first connection part 110c may be electrically connected to the first power input terminal and the first power output terminals, may overlap the integrated circuit chip IC, and may be disposed between the base film 100 and the integrated circuit chip IC. The first power output wirings may connect the first connection part and the first power output terminals, respectively.

The second power wiring 120 may include a second power input wiring 120b, a second connection part 120c, and second power output wirings 122, 124, 126, and 128. The second power input wiring may connect the second power input terminal 120a and the second connection part 120c. The second connection part 120c may be electrically connected to the second power input terminal and the second power output terminals 122a, 124a, 126a and 128a, and may be disposed between the base film 100 and the integrated circuit chip IC. The second power output wirings may connect the second connection part and the second power output terminals, respectively.

The third power wiring 130 may include a third power input wiring, a third connection part 130c, and third power output wirings 132, 134, 136, and 138. The third power input wiring may connect the third power input terminal 130a to the third connection part 130c. The third connection part 130c may be electrically connected to the third power input terminal and the third power output terminals, and may be disposed between the base film 100 and the integrated circuit chip IC. The third power output wirings may connect the third connection part and the third power output terminals, respectively.

The fourth power wiring 140 may include a fourth power input wiring, a fourth connection part 140c, and fourth power output wirings 142, 144, 146, and 148. The fourth power input wiring may connect the fourth power input terminal 140a and the fourth connection part 140c. The fourth connection part 140c may be electrically connected to the fourth power input terminal and the fourth power output terminals, and may be disposed between the base film 100 and the integrated circuit chip IC. The fourth power output wirings may connect the fourth connection part and the fourth power output terminals, respectively.

The sensing wirings S may be disposed between the data output wirings. The sensing wirings S may be connected to a sensing terminal disposed at the output part and may be electrically connected to the integrated circuit chip IC.

The first connection part 110c, the second connection part 120c, the third connection part 130c, and the fourth connection part 140c may be electrically isolated from each other, may overlap four different portions of the integrated circuit chip IC, and may divide an area where the integrated circuit chip IC is disposed into four areas. Thus, the power wirings may be efficiently distributed. For example, the first through fourth connection parts 110c, 120c, 130c, and 140c may not be electrically connected to the integrated circuit chip IC.

The second power voltage ELVSS may be applied to the first power wiring 110 and the third power wiring 130, and the first power voltage ELVDD may be applied to the second power wiring 120 and the fourth power wiring 140. Accordingly, electric currents may be sufficiently distributed at the output part, thereby preventing a local temperature rise potentially caused by concentration of currents.

Figure 6:
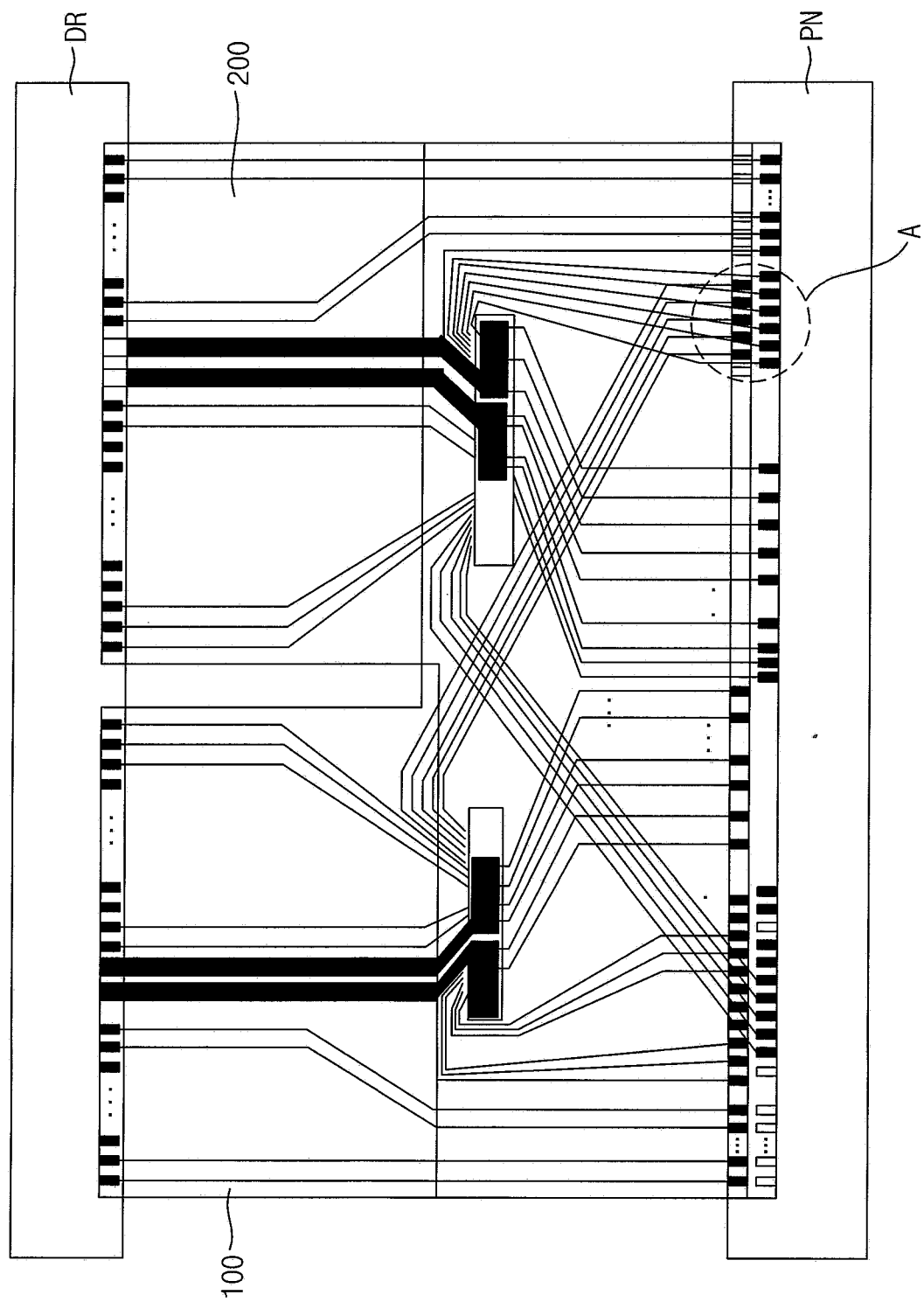
FIG. 6 is a plan view illustrating a flexible circuit film of a display apparatus according to example embodiments.
Figure 7B:
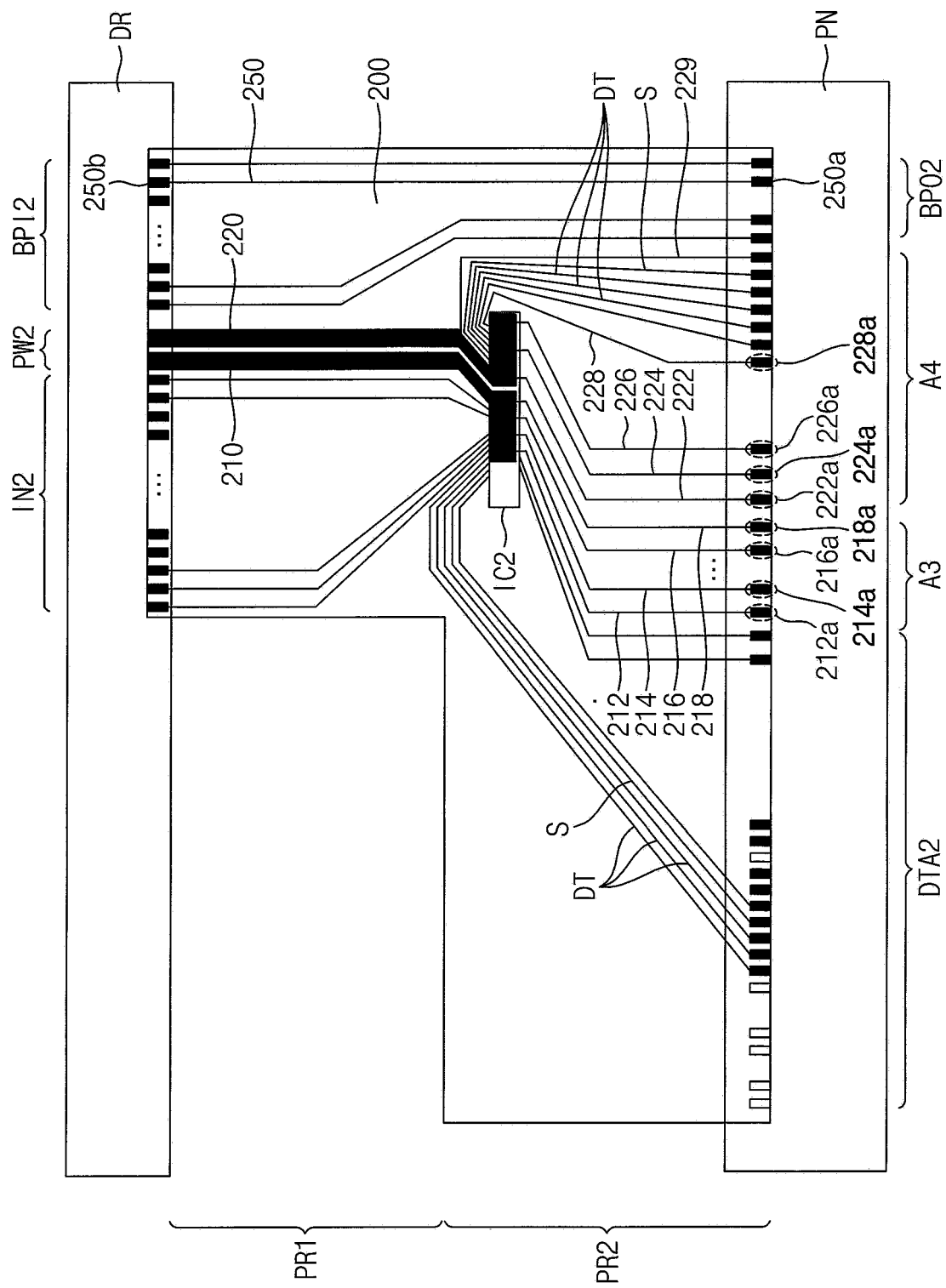
FIG. 7B is a plan view illustrating a second flexible circuit film of the flexible circuit film of FIG. 6 according to example embodiments.
Figure 8:
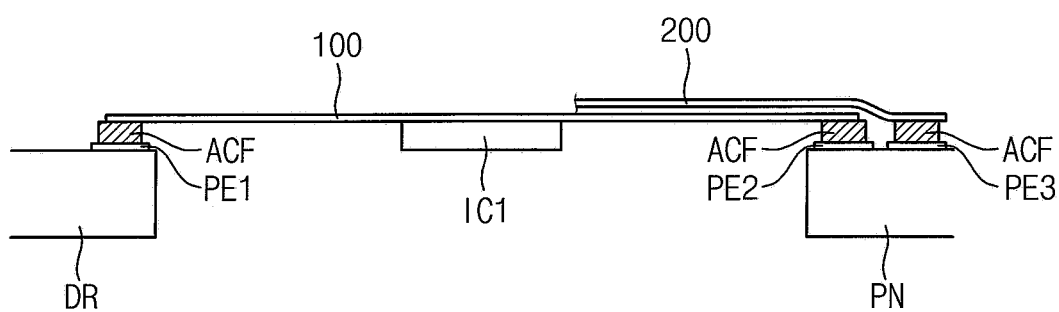
FIG. 8 is a cross-sectional view of the flexible circuit film of FIG. 6 according to example embodiments.

FIG. 6 is a plan view illustrating a flexible circuit film of a display apparatus according to example embodiments, FIG. 7A is a plan view illustrating a first flexible circuit film of the flexible circuit film of FIG. 6, FIG. 7B is a plan view illustrating a second flexible circuit film of the flexible circuit film of FIG. 6, and FIG. 8 is a cross-sectional view of the flexible circuit film of FIG. 6 according to example embodiments.

Referring to FIGS. 6 to 8, the display apparatus is substantially the same as the display apparatus of FIG. 1 except for the flexible circuit film. The flexible circuit film of the display apparatus may have features that are analogous to or substantially the same as features of the flexible circuit film described with reference to FIG. 3.

The display apparatus may include a first flexible circuit film and a second flexible circuit film. The first flexible circuit film may include a first base film 100, a wiring layer, a first integrated circuit chip IC1, and a protective layer. The second flexible circuit film may include a second base film 200, a wiring layer, a second integrated circuit chip IC2, and a protective layer.

The wiring layer of the first flexible circuit film may include a first power wiring 110 and a second power wiring 120. The wiring layer of the second flexible circuit film may include a third power wiring 210 and a fourth power wiring 220.

The first power output terminals 112a, 114a, 116a, and 118a and the second power output terminals 122a, 124a, 126a, and 128a may be electrically connected to the first power wiring 110 and the second power wiring 120 of the first flexible circuit film, respectively, may be disposed only at a left portion of the first base film 100, and may not be disposed at a right portion of the first base film 100. The first power output terminals 112a, 114a, 116a, and 118a may be disposed in a first area A1, the second power output terminals 122a, 124a, 126a, and 128a may be disposed in a second area A2, and the data output terminals may be disposed in a first data area DTA1.

The second flexible circuit film may be substantially symmetrical to and/or a mirror image of the first flexible circuit film, and thus the power wirings may be efficiently distributed in the first direction D1.

Specifically, the third power output terminals 212a, 214a, 216a, and 218a and the fourth power output terminals 222a, 224a, 226a, and 228a, may be electrically connected to the third power wiring 210 and the fourth power wiring 220 of the second flexible circuit film, respectively, may be disposed only at a right portion of the second base film 200, and may not be disposed at a left portion of the second base film 100. The third power output terminals 212a, 214a, 216a, and 218a may be disposed in a third area A3, the fourth power output terminals 222a, 224a, 226a, and 228a may be disposed in a fourth area A4, and the data output terminals may be disposed in a second data area DTA2.

The first area A1 and the second area A2 may overlap the second data area DTA2 (such that a first subset of data output terminals and a second subset of data output terminals may be respectively disposed in the areas A1 and A2), and the third area A3 and the fourth area A4 may overlap the first data area DTA1 (such that a third subset of data output terminals and a fourth subset of data output terminals may be respectively disposed in the areas A3 and A4).

The first flexible circuit film and the second flexible circuit film may at least partially overlap each other. The output part of the first flexible circuit film may be parallel to the output part of the second flexible circuit film. The output terminals of the two flexible circuit films may be disposed in a zigzag form (see portion A of FIG. 5), so that the wirings may be more efficiently disposed and wiring resistance may be minimized.

Figure 9:
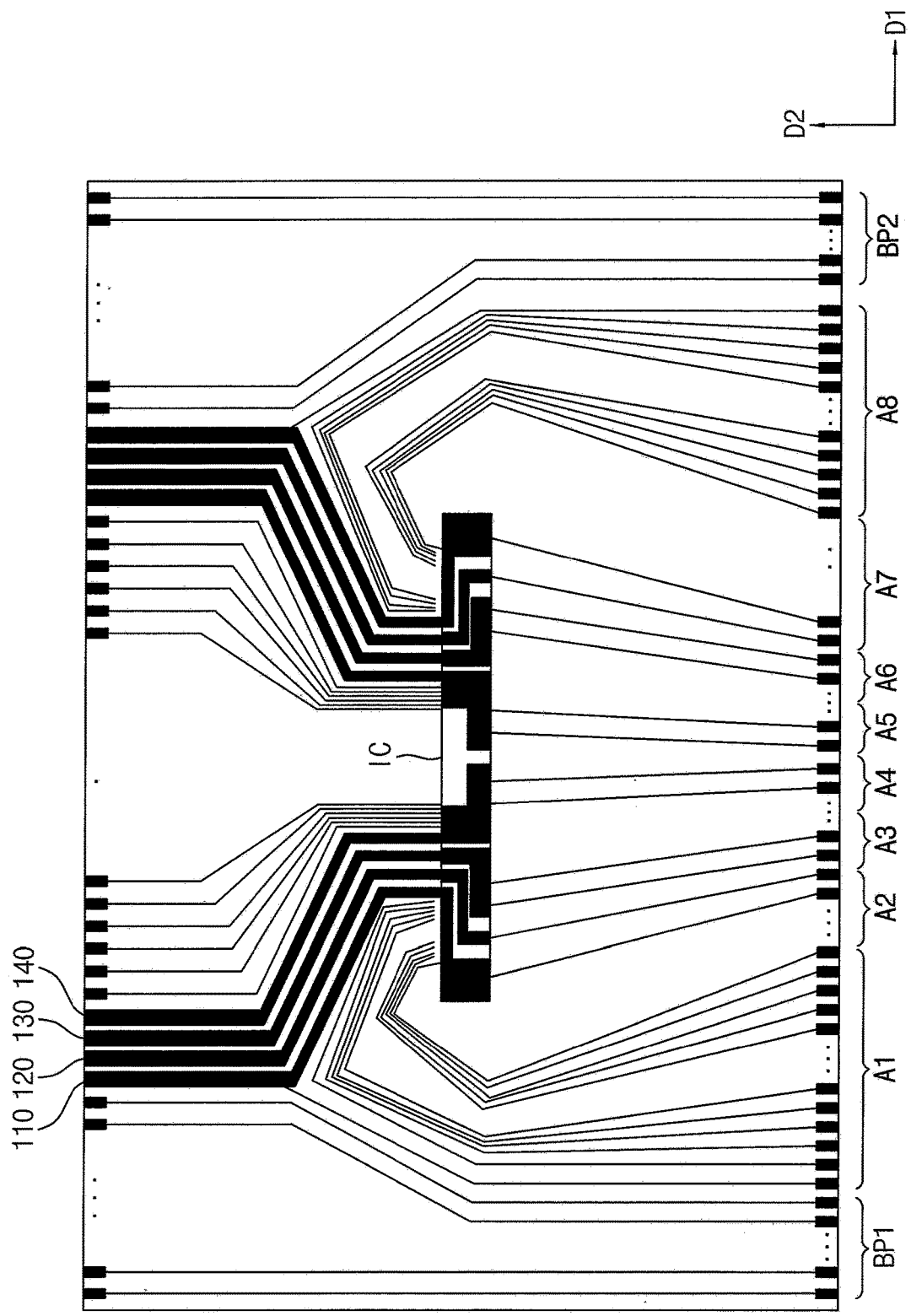
FIG. 9 is a plan view illustrating a flexible circuit film of a display apparatus according to example embodiments.

FIG. 9 is a plan view illustrating a flexible circuit film of a display apparatus according to example embodiments.

Referring to FIG. 9, the flexible circuit film is substantially the same as the flexible circuit film described with reference to FIG. 3 except that six or eight connection parts are connected to power wirings 110, 120, 130, 140, . . . , are disposed between the base film and the integrated circuit chip, and overlap six or eight different areas of FIG. 9. The flexible circuit film may include two bypass areas BP1 and BP2.

The integrated circuit chip includes six or eight areas for the power wirings, and output terminals are disposed in eight areas A1, A2, A3, A4, A5, A6, A7, and A8, so that the power wirings may be efficiently distributed.

Figure 10:
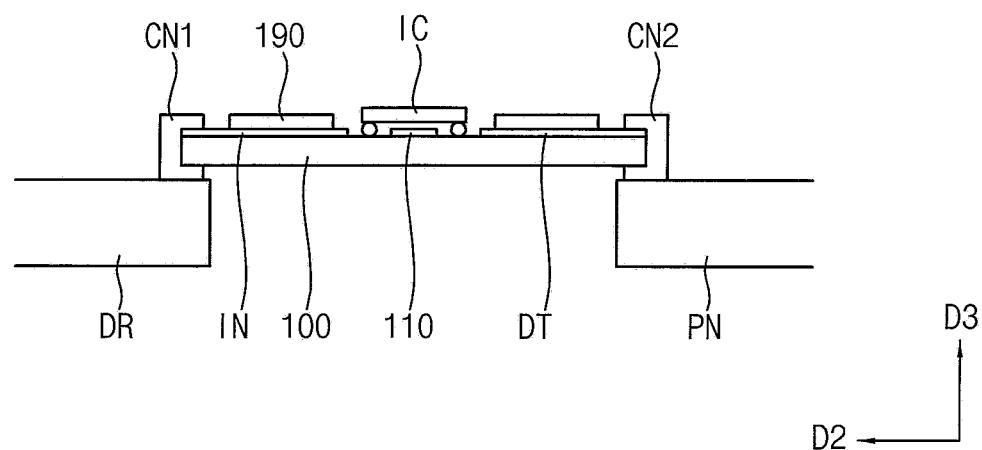
FIG. 10 is a cross-sectional view of a flexible circuit film of a display apparatus taken along a data wiring and an input wiring according to example embodiments.

FIG. 10 is a cross-sectional view of a flexible circuit film of a display apparatus taken along a data wiring and an input wiring according to example embodiments.

Referring to FIG. 10, the flexible circuit film of the display apparatus may have features that are analogous to or substantially the same as features of the flexible circuit film described with reference to the display apparatus of FIG. 5A. The base film 100 may be disposed between the integrated circuit IC and at least one of the driving circuit unit DR and the display panel PN in the third direction D3. The flexible circuit film is connected to the driving circuit unit DR and the display panel PN through a first connector CN1 and a second connector CN2, respectively. The connector CN1 may directly contact two faces of the base film 100. The connector CN1 may include a cavity/recess, and a portion of the base film 100 may be positioned inside the cavity/recess.

Figure 11:
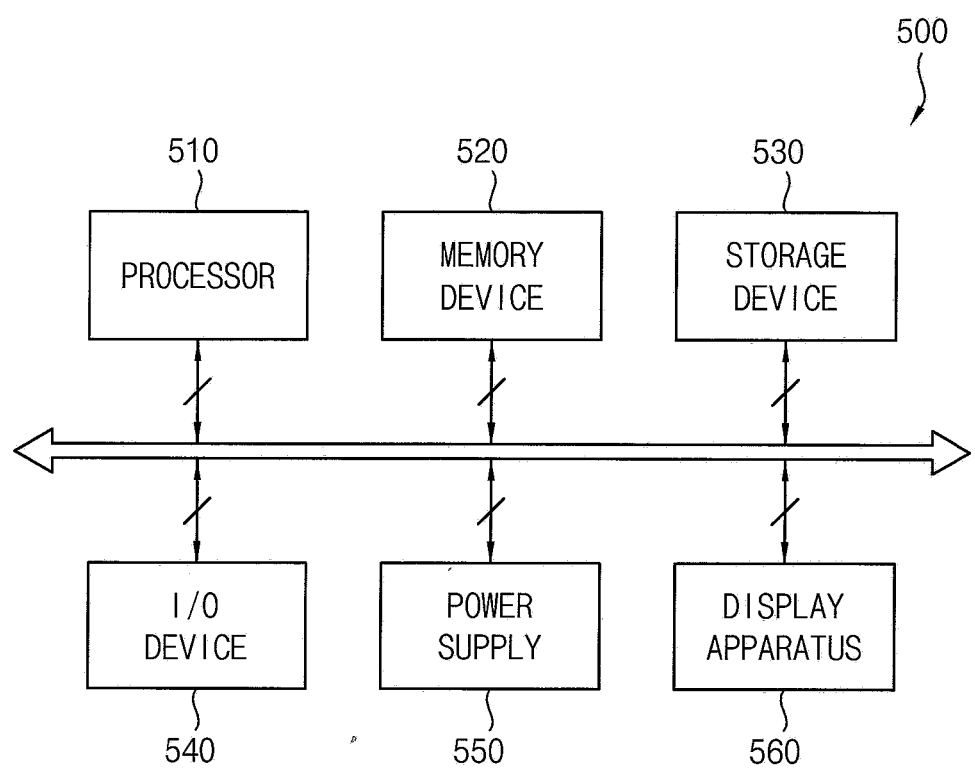
FIG. 11 is a block diagram illustrating an electronic device according to example embodiments.
Figure 12A:
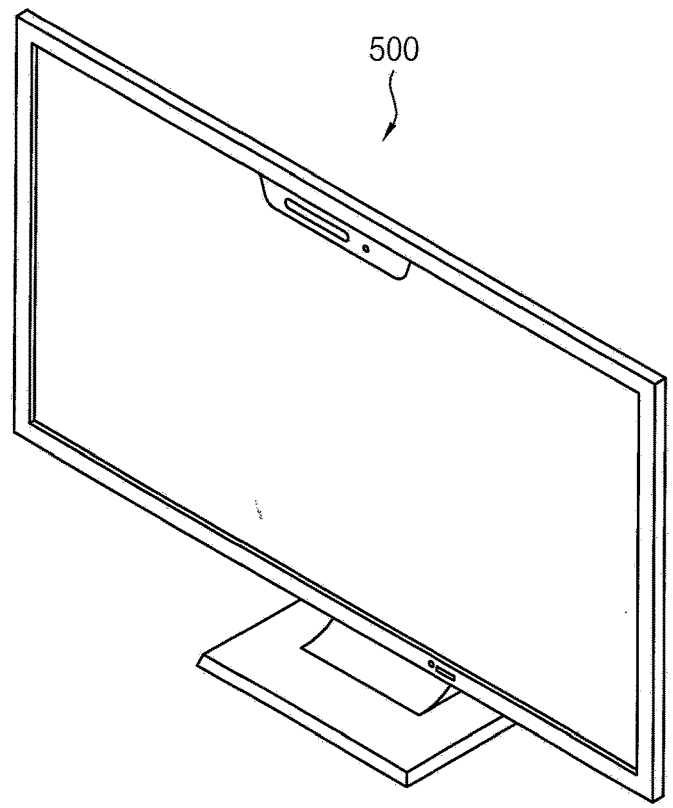
FIG. 12A is a diagram illustrating a television according to example embodiments.
Figure 12B:
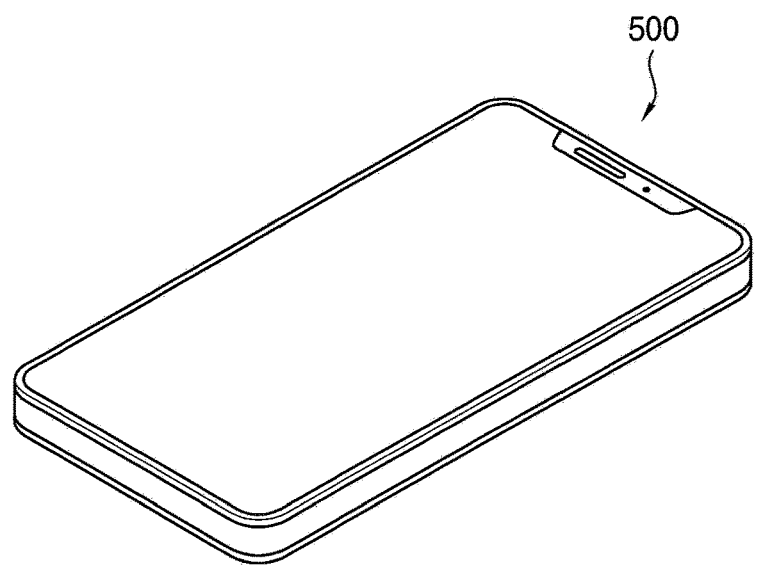
FIG. 12B is a diagram illustrating a smartphone according to example embodiments.

FIG. 11 is a block diagram illustrating an electronic device according to example embodiments, FIG. 12A is a diagram illustrating a television according to example embodiments, and FIG. 12B is a diagram illustrating a smartphone according to example embodiments.

Referring to FIGS. 11, 12A, and 12B, the electronic device 500 (e.g., television 500 or smartphone 500) may include a processor 510, a memory device 520, a storage device 530, an input/output (I/O) device 540, a power supply 550, and a display apparatus 560. The display apparatus 560 may be the display apparatus of FIG. 1. The electronic device 500 may further include a plurality of ports for communicating with a video card, a sound card, a memory card, a universal serial bus (USB) device, other electronic devices, etc. Referring to FIG. 12A, the electronic device 500 may be implemented as a television. Referring to FIG. 12B, the electronic device 500 may be implemented as a smartphone. The electronic device 500 may be implemented as at least one of a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a microprocessor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. The memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic device 500.

The display apparatus 560 may be coupled to other components via the buses or other communication links. In some example embodiments, the display apparatus 560 may be included in the I/O device 540. The display apparatus 560 may include a flexible circuit film described above.

In the flexible circuit film, a first connection part and a second connection part may overlap different areas of an integrated circuit chip, thereby efficiently distributing power wirings. Advantageously, concentration of currents may be prevented, such that potential overheating of the flexible circuit film can be prevented.

Embodiments may be applied to a display apparatus (e.g., an organic light-emitting display apparatus) and an electronic device including the display apparatus. Embodiments may be applied to a smart phone, a cellular phone, a video phone, a smart pad, a smart watch, a tablet PC, a car navigation system, a television, a computer monitor, a laptop, a head mounted display apparatus, an MP3 player, etc.

The foregoing is illustrative of example embodiments and is not to be construed as limiting. Although example embodiments have been described, many modifications are possible in the example embodiments. All such modifications are intended to be included within the scope defined in the claims.

What is claimed is:

1. A flexible circuit film comprising:
a base film;
an integrated circuit chip disposed on the base film; and
a first power wiring set configured to receive a first power voltage, which is transmitted to a display panel, and including a first connection part disposed between the integrated circuit chip and the base film, wherein the first connection part is electrically conductive, overlaps the integrated circuit chip, and is not electrically connected to the integrated circuit chip, wherein the first power wiring set further includes a single integral first power input wire and a first power output wire set including multiple first power output wires, the first connection part electrically coupling the first power input wire to the first power output wire set.

2. The flexible circuit film of claim 1, wherein the first power input wire is wider than each of the first power output wires.

3. The flexible circuit film of claim 2, wherein the first power input wire electrically couples a first power input terminal to the first connection part, and wherein the first power output wire set electrically couples the first connection part to a first power output terminal set.

4. The flexible circuit film of claim 1, further comprising:
a second power wiring set configured to receive a second power voltage, which is transmitted to the display panel and different from the first power voltage, and including a second connection part disposed between the integrated circuit chip and the base film and spaced from the first connection part, wherein the second connection part is electrically conductive, overlaps the integrated circuit chip, and is not electrically connected to the integrated circuit chip, wherein the second power wiring set further includes a single integral second power input wire and a second power output wire set including multiple second power output wires, the second connection part electrically coupling the second power input wire to the second power output wire set.

5. The flexible circuit film of claim 4, wherein the second power input wire is wider than each of the second power output wires.

6. The flexible circuit film of claim 5, wherein the second power input wire electrically couples a second power input terminal to the second connection part, and wherein the second power output wire set electrically couples the second connection part to a second power output terminal set.

7. The flexible circuit film of claim 4, further comprising:
a third power wiring set configured to receive the first power voltage and including a third connection part disposed between the integrated circuit chip and the base film and spaced from the first connection part and the second connection part, wherein the third connection part is electrically conductive, overlaps the integrated circuit chip, and is not electrically connected to the integrated circuit chip, wherein the third power wiring set further includes a single integral third power input wire and a third power output wire set including multiple third power output wires, the third connection part electrically coupling the third power input wire to the third power output wire set.

8. The flexible circuit film of claim 7, wherein the third power input wire is wider than each of the third power output wires.

9. The flexible circuit film of claim 8, wherein the third power input wire electrically couples a third power input terminal to the third connection part, and wherein the third power output wire set electrically couples the third connection part to a third power output terminal set.

10. The flexible circuit film of claim 4, further comprising:
a fourth power wiring set configured to receive the second power voltage and including a fourth connection part disposed between the integrated circuit chip and the base film and spaced from the first connection part and the second connection part, wherein the fourth connection part is electrically conductive, overlaps the integrated circuit chip, and is not electrically connected to the integrated circuit chip, wherein the fourth power wiring set further includes a single integral fourth power input wire and a fourth power output wire set including multiple fourth power output wires, the fourth connection part electrically coupling the fourth power input wire to the fourth power output wire set.

11. The flexible circuit film of claim 10, wherein the fourth power input wire is wider than each of the fourth power output wires.

12. The flexible circuit film of claim 11, wherein the fourth power input wire electrically couples a fourth power input terminal to the fourth connection part, and wherein the fourth power output wire set electrically couples the fourth connection part to a fourth power output terminal set.

13. The flexible circuit film of claim 1, further comprising:
data input wires;
data output wires;
data input terminals respectively electrically coupled to the data input wires; and
data output terminals respectively electrically coupled to the data output wires.

14. The flexible circuit film of claim 13, further comprising:
first-group connectors; and
second-group connectors disposed between the first-group connectors and the data output terminals,
wherein the data input wires are electrically coupled to the first-group connectors, respectively, and wherein data output wires of at least a first subset of the data output wires are electrically coupled to the second-group connectors, respectively.

15. The flexible circuit film of claim 14, further comprising:
third-group connectors, wherein the second-group connectors are disposed between the third-group connectors and the data output terminals, and wherein data output wires of a second subset of the data output wirings are electrically coupled to the third-group connectors, respectively.

16. A display apparatus comprising:
a display panel having pixels and configured to display an image;
a driving circuit unit configured to provide a first power voltage and a second power voltage different from the first power voltage; and
a flexible circuit film disposed between the display panel and the driving circuit unit and configured to transmit the first power voltage and the second power voltage to the display panel,
wherein the flexible circuit film comprises:
a base film;
an integrated circuit chip disposed on the base film;
a first power wiring set configured to receive the first power voltage and including a first connection part disposed between the integrated circuit chip and the base film, wherein the first connection part is electrically conductive, overlaps the integrated circuit chip, and is not electrically connected to the integrated circuit chip, wherein the first power wiring set further includes a single integral first power input wire and a first power output wire set including multiple first power output wires, the first connection part electrically coupling the first power input wire to the first power output wire set; and
a second power wiring set configured to receive the second power voltage and including a second connection part disposed between the integrated circuit chip and the base film and spaced from the first connection part, wherein the second connection part is electrically conductive, overlaps the integrated circuit chip, and is not electrically connected to the integrated circuit chip, wherein the second power wiring set further includes a single integral second power input wire and a second power output wire set including multiple second power output wires, the second connection part electrically coupling the second power input wire to the second power output wire set.

17. The display apparatus of claim 16, wherein the flexible circuit film further comprises:
a third power wiring set configured to receive the first power voltage and including a third connection part disposed between the integrated circuit chip and the base film and spaced from the first connection part and the second connection part, wherein the third connection part is electrically conductive, overlaps the integrated circuit chip, and is not electrically connected to the integrated circuit chip, wherein the third power wiring set further includes a single integral third power input wire and a third power output wire set including multiple third power output wires, the third connection part electrically coupling the third power input wire to the third power output wire set.

18. The display apparatus of claim 16, wherein the flexible circuit film further comprises:
a fourth power wiring set configured to receive the second power voltage and including a fourth connection part disposed between the integrated circuit chip and the base film and spaced from the first connection part and the second connection part, wherein the fourth connection part is electrically conductive, overlaps the integrated circuit chip, and is not electrically connected to the integrated circuit chip, wherein the fourth power wiring set further includes a single integral fourth power input wire and a fourth power output wire set including multiple fourth power output wires, the fourth connection part electrically coupling the fourth power input wire to the fourth power output wire set.

19. The display apparatus of claim 16, wherein the flexible circuit film further comprises:
data input wires;
data output wires;

data input terminals respectively electrically coupled to the data input wires; and data output terminals respectively electrically coupled to the data output wires.

20. The display apparatus of claim 19, wherein the flexible circuit film further comprises:

first-group connectors;

second-group connectors disposed between the first-group connectors and the data output terminals; and third-group connectors, the second-group connectors being disposed between the third-group connectors and the data output terminals, wherein the data input wires are electrically coupled to the first-group connectors, respectively, wherein data output wires of at least a first subset of the data output wires are electrically coupled to the second-group connectors, respectively, and wherein data output wires of a second subset of the data output wirings are electrically coupled to the third-group connectors, respectively.

\* \* \* \* \*